US009423692B2

(12) United States Patent
Han et al.

(10) Patent No.: US 9,423,692 B2
(45) Date of Patent: Aug. 23, 2016

(54) COMPOSITION FOR FORMING RESIST PROTECTION FILM FOR LITHOGRAPHY AND METHOD FOR FORMING PATTERN OF SEMICONDUCTOR DEVICE USING THE SAME

(71) Applicant: Dongjin Semichem Co., Ltd., Incheon (KR)

(72) Inventors: Man Ho Han, Gyeonggi-do (KR); Jong Kyoung Park, Gyeonggi-do (KR); Hyun Jin Kim, Gyeonggi-do (KR); Jae Hyun Kim, Seoul (KR)

(73) Assignee: Dongjin Semichem Co., Ltd. (KR)

( * ) Notice: Subject to any disclaimer, the term of this patent is extended or adjusted under 35 U.S.C. 154(b) by 0 days.

(21) Appl. No.: 14/851,934

(22) Filed: Sep. 11, 2015

(65) Prior Publication Data

US 2016/0004159 A1 Jan. 7, 2016

Related U.S. Application Data

(63) Continuation of application No. PCT/KR2014/001967, filed on Mar. 11, 2014.

(30) Foreign Application Priority Data

Mar. 11, 2013 (KR) ........................ 10-2013-0025748

(51) Int. Cl.
| | |
|---|---|
| G03F 7/11 | (2006.01) |
| G03F 7/16 | (2006.01) |
| G03F 7/38 | (2006.01) |
| G03F 7/32 | (2006.01) |
| C09D 133/16 | (2006.01) |
| C09D 4/06 | (2006.01) |
| G03F 7/004 | (2006.01) |
| G03F 7/20 | (2006.01) |
| G03F 7/34 | (2006.01) |

(52) U.S. Cl.
CPC .. *G03F 7/11* (2013.01); *C09D 4/06* (2013.01); *C09D 133/16* (2013.01); *G03F 7/0045* (2013.01); *G03F 7/168* (2013.01); *G03F 7/2041* (2013.01); *G03F 7/32* (2013.01); *G03F 7/34* (2013.01); *G03F 7/38* (2013.01); *C08L 2203/16* (2013.01)

(58) Field of Classification Search
None
See application file for complete search history.

(56) References Cited

U.S. PATENT DOCUMENTS

| | | | |
|---|---|---|---|
| 5,607,816 A | 3/1997 | Fitzgerald et al. | |
| 6,939,662 B2* | 9/2005 | Mizutani | G03F 7/0046 430/270.1 |
| 8,057,981 B2* | 11/2011 | Harada | G03F 7/0045 430/270.1 |
| 8,697,331 B2* | 4/2014 | Sakakibara | C07C 69/96 430/270.1 |
| 2007/0087125 A1* | 4/2007 | Maeda | G03F 7/11 427/402 |
| 2007/0178407 A1* | 8/2007 | Hatakeyama | C08F 220/18 430/270.1 |
| 2007/0275326 A1* | 11/2007 | Hatakeyama | G03F 7/11 430/270.1 |
| 2009/0061360 A1* | 3/2009 | Takebe | G03F 7/2041 430/311 |
| 2011/0151378 A1* | 6/2011 | Matsumura | C07C 69/96 430/270.1 |
| 2011/0177455 A1* | 7/2011 | Harada | C08F 14/18 430/285.1 |
| 2012/0003589 A1* | 1/2012 | Park | C08F 14/18 430/313 |
| 2012/0003591 A1* | 1/2012 | Enomoto | G03F 7/0382 430/325 |
| 2012/0083580 A1* | 4/2012 | Kinsho | C07C 51/00 526/242 |
| 2012/0088194 A1* | 4/2012 | Tsubaki | G03F 7/0392 430/319 |
| 2012/0214100 A1* | 8/2012 | Kobayashi | G03F 7/0045 430/285.1 |
| 2012/0295197 A1* | 11/2012 | Kiridoshi | C08F 220/22 430/270.1 |
| 2013/0022912 A1* | 1/2013 | Sato | C08F 220/28 430/270.1 |
| 2013/0084517 A1* | 4/2013 | Suka | G03F 7/0046 430/5 |
| 2013/0252170 A1* | 9/2013 | Han | C08F 22/06 430/270.1 |
| 2015/0086929 A1* | 3/2015 | Hatakeyama | G03F 7/40 430/324 |

FOREIGN PATENT DOCUMENTS

| | | |
|---|---|---|
| JP | 2008-050422 | 3/2008 |
| JP | 2008-179789 | 8/2008 |
| KR | 10-2006-0082787 | 7/2006 |
| KR | 10-2010-0062948 | 6/2010 |
| KR | 10-2012-0002191 | 1/2012 |
| WO | 2012/064097 | * 5/2012 |

OTHER PUBLICATIONS

J.-L. M. Abboud and R. Notario, Critical Compilation of Scales of Solvent Parameters, Part I, Pure, Non-hydrogen Bond Donor Solvents, Pure Appl. Chem., vol. 71, No. 4, pp. 645-718 (1999).*
John Burke, The Book and Paper Group Annual, vol. 3 (1984) 38 pages.*
Barton, "CRC Handbook of solubility parameters and other cohesion proerties", 2nd Ed., pp. 250-257 (1991).*

(Continued)

*Primary Examiner* — Martin Angebranndt
(74) *Attorney, Agent, or Firm* — Brinks Gilson & Lione

(57) ABSTRACT

Provided are a composition for forming a resist protection film for lithography and a method for forming a pattern of a semiconductor device using the same. The composition comprises a repeat unit having a fluorine-containing functional group on a side chain thereof and contains a polymer having a weight average molecular weight of 2,000-100,000 and a solvent. The solvent containing 10-100 parts by weight of a material has a Hildebrand solubility parameter of 12.5-22.0, based on 100 parts by weight of the total weight thereof.

13 Claims, No Drawings

(56) References Cited

OTHER PUBLICATIONS

J.-L. M. Abbound and R. Notario, "Critical compellation of scales of solvent parameters, Part 1, Pure, non-hydrogen bond donor solvents", Pure Appl. Chem., vol. 71(4) pp. 645-718 (1999) (submitted by applicant).*
John Burke, The Book and paper Annula, vol. 3, 38 pages (1984) (submitted by applicant).*
Barton, "CRC Handbook of solubility parameters and other cohesion properties", 2nd Ed, pp. 250-257 (1991).*
Machine translation of WO-2012/064097 (2012).*
International Search Report and Written Opinion issued in corresponding case PCT/KR2014/001967, dated Jun. 26, 2014, pp. 1-13.

* cited by examiner

COMPOSITION FOR FORMING RESIST PROTECTION FILM FOR LITHOGRAPHY AND METHOD FOR FORMING PATTERN OF SEMICONDUCTOR DEVICE USING THE SAME

PRIORITY CLAIM

This application is a continuation application of Patent Cooperation Treaty (PCT) international application Ser. No. PCT/KR2014/001967, filed on Mar. 11, 2014, and which designates the United States, which claims the benefit of the filing date of Korean Patent Application Serial No. 10-2013-0025748, filed on Mar. 11, 2013. The entirety of both PCT international application Serial No. PCT/KR2014/001967 and Korean Patent Application Serial No. 10-2013-0025748 are incorporated herein by reference.

TECHNICAL FIELD

One or more embodiments of the present invention relate to a resist protective film composition for lithography and a method of forming a pattern of a semiconductor device using the composition.

BACKGROUND ART

The statements in this section merely provide background information related to the present disclosure and may not constitute prior art.

Lithography methods are widely used in the production of microscopic structures in a variety of electronic devices such as semiconductor devices and liquid crystal devices. Ongoing miniaturization of the structures of these devices has lead to demands for further miniaturization of resist patterns used in these lithography processes.

Currently, in the most up-to-date fields, fine resist patterns with a line width of approximately 90 nm are able to be formed by lithography. In the future, however, even finer pattern formation will be required.

In order to enable the formation of these types of ultra fine patterns of less than 90 nm, the development of appropriate exposure apparatus and corresponding resist is the first requirement. With respect to the exposure apparatus, techniques such as shortening the wavelength of a, light source for $F_2$ excimer lasers, extreme ultraviolet radiation (EUV), electron beams, X-rays, and soft X-rays or increasing the number of aperture (NA) of a lens are being developed.

However, shortening the wavelength of the light source requires a new and expensive exposure apparatus. Furthermore, if the NA value is increased, since the resolution and the depth of focus exist in a trade-off type relationship, even if the resolution is increased, a problem arises in that the depth of focus is lowered.

Recently, as a lithography technology for allowing such problems to be solved, a method known as liquid immersion lithography has been reported. In this method, exposure is conducted in a state where liquid refractive index media such as pure water or a fluorine-based inert liquid (e.g., refractive index liquid and immersion liquid) is disposed in a predetermined thickness on at least a resist film between a lens and the resist film formed on a substrate. In this method, the space of an exposure light path conventionally filled with inert gas such as air or nitrogen is replaced with a liquid having a larger refractive index (n), for example pure water to attain high resolution without a decrease in focal depth width in a manner similar to the use of a light source of shorter wavelength or a high NA lens even if the optical source having the same exposure wavelength is employed.

Such liquid immersion lithography has been remarkably noticed because the use thereof allows a lens implemented in the existing device to realize the formation of a resist pattern excellent in higher resolution property as well as excellent in focal depth in low costs.

DETAILED DESCRIPTION OF THE INVENTION

Technical Problem

One or more embodiments of the present invention include a resist protective film composition for lithography with improved coating compactness to a substrate.

One or more embodiments of the present invention include a method of forming a pattern of a semiconductor device using the resist protective film composition for lithography.

Technical Solution

According to one or more embodiments of the present invention, there is provided a resist protective film composition for lithography, the composition including: a polymer having a weight average molecular weight of 2,000 to 100,000 including a repeating unit having a fluorine-containing functional group at a side chain of the polymer; and a solvent, wherein the solvent includes a material having a Hildebrand solubility parameter of 12.5 to 22.0, and an amount of the material having a Hildebrand solubility parameter of 12.5 to 22.0 is 10 to 90 parts by weight based on 100 parts by weight of the total weight of the solvent.

According to one or more embodiments of the present invention, there is provided a method of forming a pattern of a semiconductor device, the method including: coating the resist protective film composition for lithography on a photoresist layer formed on a substrate; baking the resist protective film composition for lithography to form a resist protective film; post-baking the photoresist layer, on which the resist protective film is formed, after performing a liquid immersion lithography process; developing the post-baked photoresist layer by using a developer to form a predetermined photoresist pattern on the substrate; and etching an etched layer by using the photoresist pattern as an etching mask to form a etched layer pattern.

Advantageous Effects of the Invention

According to one or more embodiments of the present invention, a resist protective film composition for lithography has improved coating compactness, and when the composition is used in a lithography process while performing the coating, a resist protective film having increased compactness and decreased coating defect may be obtained.

MODE OF THE INVENTION

Hereinafter, a resist protective film composition for lithography according to one or more embodiments of the present invention is described in detail.

According to an embodiment of the present invention, a resist protective film composition for lithography is provided, wherein the resist protective film composition for lithography includes a polymer with a weight average molecular weight of 2,000 to 100,000 including a repeating unit having a fluorine-containing functional group at a side chain of the polymer; and a solvent, wherein the solvent includes a material having a Hildebrand solubility parameter of 12.5 to 22.0, and an amount of the material having Hildebrand solubility parameter of 12.5 to 22.0 is 10 to 90 parts by weight based on 100 parts by weight of the total weight of the solvent.

The resist protective film composition for lithography may be, for example, a resist protective film composition for liquid immersion lithography.

However, after forming the resist protective film on a substrate by using the polymer with a weight average molecular weight of 2,000 to 100,000 including a repeating unit having a fluorine-containing functional group at a side chain of the polymer, since extreme thickness deviation of the resist protective film to the substrate may occur during a process of evaluating the resist protective film, coating compactness of the resist protective film is not sufficient, and thus the evaluation itself may be difficult as the number of evaluation failures is high.

The present inventors used a solvent, which is well blended with the polymer with a weight average molecular weight of 2,000 to 100,000 including a repeating unit having a fluorine-containing functional group on a side chain of the polymer and includes a material with a Hildebrand solubility parameter of 12.5 to 22.0 having excellent solubility characteristics with respect to the polymer, and limited an amount of the solvent to a predetermined range, and thus solubility characteristics of the resist protective film may be excellent with respect to the polymer forming the resist protective film, and coating compactness of the resist protective film with respect to the substrate may significantly improve.

An amount of the material having the solubility parameter of 12.5 to 22.0 is within a range of 10 to 90 parts by weight based on 100 parts by weight of the total weight of the solvent.

The term "coating compactness" is defined as a coating uniformity for whether a coating layer is appropriately distributed on a wafer or not, and the coating compactness is evaluated by obtaining thicknesses of resist protective films in a predetermined area of the resist protective film formed on a substrate and by following a method of calculating a deviation of the thicknesses. When the resist protective film has uniform thicknesses as a thickness deviation of the resist protective film is small, the coating compactness is excellent.

The Hildebrand solubility parameter ($\delta$) of a solvent is defined as the square root of the cohesive energy density (c), and this is expressed in Equation 1 below:

$$\delta = \sqrt{\frac{\Delta H_v - RT}{V_m}} \quad \text{[Equation 1]}$$

In Equation 1, $\Delta Hv$ is a vaporization enthalpy, R is a gas constant, and Vm is a molar volume.

A unit of the Hildebrand solubility parameter is generally $cal^{1/2}cm^{-3/2}$, and the Hildebrand solubility parameter has an SI unit of $MPa^{1/2}$.

If the Hildebrand solubility parameter of a solvent contained in a resist protective film composition for lithography is less than 12.5 or greater than 22.0, blending characteristics and solubility characteristics of the solvent with respect to a polymer forming the resist protective film decrease, and thus coating compactness of the resist protective film is not desirable.

The solvent with the Hildebrand solubility parameter of 12.5 to 22.0 is measured at a temperature of 25° C. and has 3 to 16 carbon atoms and 1 to 4 oxygen atoms. The coating compactness of the solvent having 3 to 16 carbon atoms and 1 to 4 oxygen atoms is excellent.

Examples of the material having Hildebrand solubility parameter of 12.5 to 22.0 include at least one selected from 2,5-dimethyltetrahydrofuran, methyl hexanoate, 1,2-epoxypropane, 4-methyl-1,3-dioxane, 2-methoxy-1,3-dioxane, 2-ethyl-2-methyl-1,3-dioxane, dibutyl adipate, isoamyl acetate, cyclohexyl acetate, ethyl 3-oxohexanoate, 2,2,4,4-tetramethyl-3-pentanone, 2,4-dimethyl-3-pentanone, 4-heptanone, cyclopropyl methyl ketone, 3,3-dimethyl-2-butanone, and butyl acetate.

The solvent may further include an alkoxyalkane solvent and an alcohol solvent.

An amount of the alkoxyalkane solvent is 10 to 1000 parts by weight based on 100 parts by weight of the material having the Hildebrand solubility parameter of 12.5 to 22.0. Here, when, an amount of the alkoxyalkane solvent is within this range, the resist protective film has excellent non-invasive characteristics.

An amount of the alcohol solvent is 10 to 1000 parts by weight based on 100 parts by weight of the material having the Hildebrand solubility parameter of 12.5 to 22.0. Here, when an amount of the alcohol solvent is within this range, the resist protective film has excellent non-invasive characteristics.

Examples of the alcohol solvent include a C4-C11 monovalent alcohol, such as, 1-heptanol, 2-heptanol, 3-heptanol, 4-heptanol, 1-butylalcohol, 2-butylalcohol, isobutylalcohol, tert-butylalcohol, 1-pentanol, 2-pentanol, 3-pentanol, tert-amylalcohol, neopentylalcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, 2,6-dimethyl-4-heptanol, 3,5,5-trimethyl-1-hexanol, 1-nonanol, 1-decanol, methyl-n-octylcarbynol, ethylheptylcarbynol, hexylpropylcarbynol, amylbutylcarbynol, 2-undecanol, 3-undecanol, 4-undecanol, 5-undecanol, or 3,7-dimethyl-1-octanol; a C4-C11 divalent alcohol, such as, ethyleneglycol, propyleneglycol, 4-hydroxy-4-methyl-2-pentanol, 2-ethyl-1,3-hexanediol, 1,3-butanediol, 1,2-propanediol, 1,3-propanediol, or 1,2-heptanediol; or a C4-C20 polyvalent alcohol.

The alkoxyalkane solvent may be C3-C16 dialkoxyalkane, trialkoxyalkane or tetraalkoxyalkane. Examples of the alkoxyalkane solvent include at least one selected from dimethoxymethane, diethoxymethane, dibutoxymethane, trimethoxymethane, triethoxymethane, tripropoxymethane, 1,1-dimethoxyethane, 1,2-dimethoxyethane, 1,1-diethoxyethane, 1,2-diethoxyethane 1,2-dibutoxyethane, 1,1,1-trimethoxyethane, 1,1-diethoxypropane, 2,2-dimethoxypropane, 2,2-diethoxypropane, 1,1-diethoxyisobutane 1,5-dimethoxypentane, 1,6-dimethoxyhexane, 1,1-dimethoxyoctane, 1,1-dimethoxydodecane, bis(2-ethoxyethyl)ether, and bis(2-methoxyethyl)ether.

In one embodiment, a solvent of a resist protective film composition for lithography includes a material having the Hildebrand solubility parameter of 12.5 to 22.0, wherein the material is one selected from 2,5-dimethyltetrahydrofuran, 2,4-dimethyl-3-pentanone, methylhexanoate, and 1,2-epoxypropane; 1,1-diethoxypropane, which is an alkoxyalkane solvent; and 2-heptanol, which is an alcohol solvent. Here, an amount of 1,1-diethoxypropane is 12.5 to 750 parts by weight based on 100 parts by weight of the one selected from 2,5-dimethyltetrahydrofuran, 2,4-dimethyl-3-pentanone, methylhexanoate, and 1,2-epoxypropane, and an amount of 2-heptanol is 12.5 to 200 parts by weight based on 100 parts by weight of the one selected from 2,5-dimethyltetrahydrofuran, 2,4-dimethyl-3-pentanone, methylhexanoate, and 1,2-epoxypropane.

In the resist protective film composition, the polymer includes at least one selected from repeating units represented by Formulas 1, 2, and 3 on a side chain of the polymer, and the repeating unit, as an essential repeating unit, has a fluorine-containing functional group at the side chain.

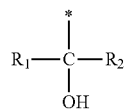

[Formula 1]

In Formula 1, $R_1$ and $R_2$ are each independently one selected from a hydrogen atom, a C1-C20 alkyl group, and a C1-C20 fluorinated alkyl group, where at least one of $R_1$ and $R_2$ is a C1-C20 fluorinated alkyl group, and * denotes a binding site connected to a main chain of the polymer.

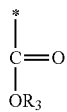

[Formula 2]

In Formula 2, $R_3$ is a hydrogen atom, a C1-C20 fluorinated alkyl group, a C1-C20 alkyl group, or an organic group having a polar group, and * denotes a binding site connected to a main chain of the polymer.

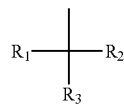

[Formula 3]

In Formula 3, $R_1$ and $R_2$ are each independently a hydrogen atom, a C1-C20 hydroxyalkyl group or a C1-C20 fluorinated hydrocarbon group, and $R_3$ is a C1-C20 hydroxyalkyl group or a C1-C4 hydrocarbon group.

The polymer is at least one selected from a polymer including a repeating unit represented by Formula 4, a polymer including a repeating unit represented by Formula 5, a polymer including a repeating unit represented by Formula 6, and a polymer including a repeating unit represented by Formula 7.

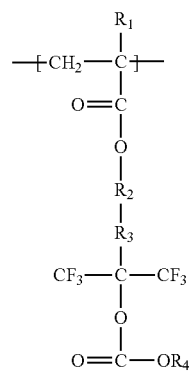

[Formula 4]

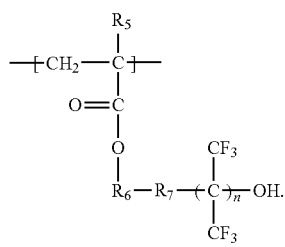

[Formula 5]

In Formula 4,
$R_1$ and $R_4$ are each independently a hydrogen atom (H), a fluorine atom (F), or a substituted or unsubstituted C1-C20 alkyl group,
$R_2$ is a substituted or unsubstituted C1-C20 alkylene group or a substituted or unsubstituted C1-C20 cyclic alkylene group, and
$R_3$ is a simple bond or a substituted or unsubstituted C1-C20 alkylene group.

In Formula 5,
$R_5$ is a hydrogen atom (H), a fluorine atom (F), or a substituted or unsubstituted C1-C20 alkyl group,
$R_6$ is a substituted or unsubstituted C1-C20 alkylene group or a substituted or unsubstituted C1-C20 cyclic alkylene group, and
$R_7$ is a single bond or a substituted or unsubstituted C1-C20 alkylene group.

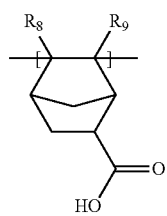

[Formula 6]

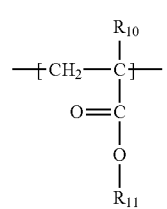

[Formula 7]

In Formula 6,
$R_8$ and $R_9$ are each independently a hydrogen atom (H), a fluorine atom (F), or a substituted or unsubstituted C1-C20 alkyl group.

In Formula 7, $R_{10}$ is a hydrogen atom (H), a fluorine atom (F), or a substituted or unsubstituted C1-C20 alkyl group, and $R_{11}$ is a substituted or unsubstituted C1-C20 alkyl group, a substituted or unsubstituted C1-C20 cyclic alkyl group, or a group represented by Formula 7a:

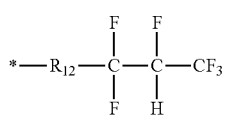

[Formula 7a]

In Formula 7a, $R_{12}$ is a simple bond or a substituted or unsubstituted C1-C20 alkylene group, and

* denotes a binding site.

In Formulas 4 to 7, the substituted C1-C20 alkyl group is, for example, a fluorinated C1-C20 alkyl group. Also, the substituted C1-C20 cyclic alkyl group is, for example, a fluorinated C1-C20 cyclic alkyl group.

The polymer has a weight average molecular weight of 1,000 to 100,000, for example, 3,000 to 50,000 or 5,000 to 20,000. Here, when a weight average molecular weight of the polymer is less than 1,000, an ability of forming a resist protective film decreases, and when a weight average molecular weight of the polymer is greater than 100,000, solubility of the polymer in alkaline solution decreases and a viscosity of the resist protective film composition including the polymer increases, and thus the polymer may not be used as a polymer for forming a resist protective film.

Also, a polymer dispersion index (PDI), which is a ratio (Mw/Mn) of a weight average molecular weight (Mw) and a number-average molecular weight with a polystyrene standard by gel permeation chromatography (GPC) (Mn) is 1 to 5, for example, 1 to 3.

Examples of the repeating unit represented by Formula 4 may include a repeating unit represented by one of Formula 4-1 to Formula 4-5, but the repeating unit is not limited thereto:

[Formula 4-1]

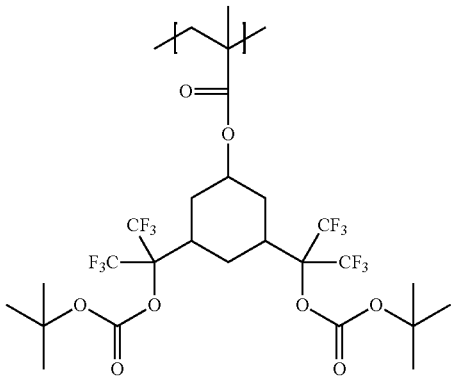

[Formula 4-2]

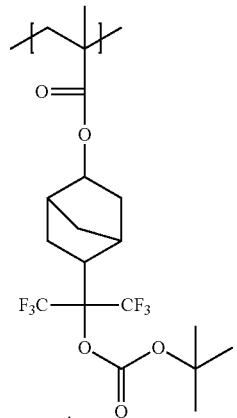

[Formula 4-3]

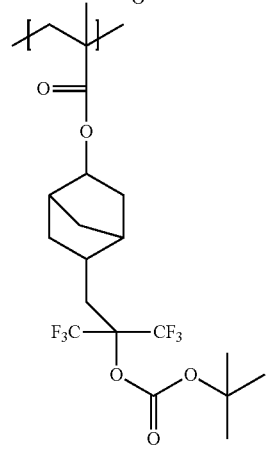

[Formula 4-4]

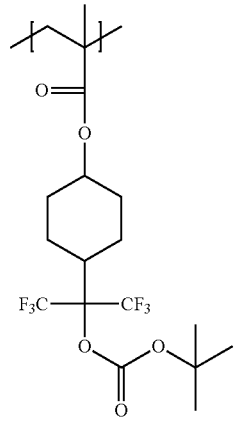

[Formula 4-5]

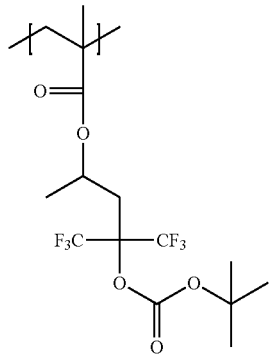

Examples of the repeating unit represented by Formula 5 may include a repeating unit represented by one of Formula 5-1 to Formula 5-5, but the repeating unit is not limited thereto:

[Formula 5-1]
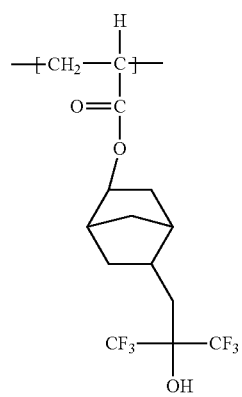

[Formula 5-2]
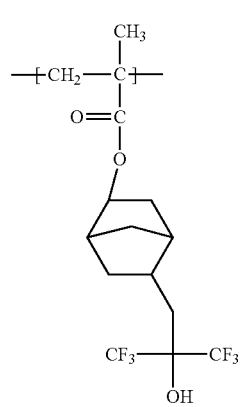

[Formula 5-3]
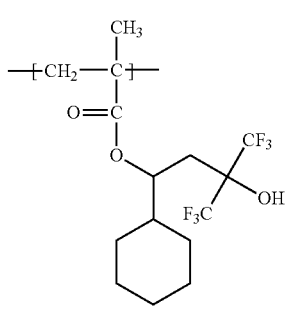

[Formula 5-4]
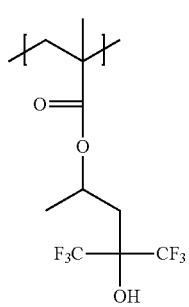

[Formula 5-5]
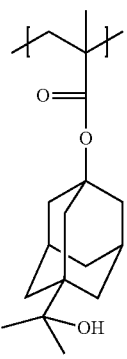

Examples of the repeating unit represented by Formula 6 may include a repeating unit represented by Formula 6-1, but the repeating unit is not limited thereto:

[Formula 6-1]
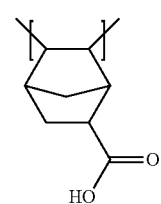

Examples of the repeating unit represented by Formula 7 may include a repeating unit represented by one of Formula 7-1 to Formula 7-6, but the repeating unit is not limited thereto:

[Formula 7-1]
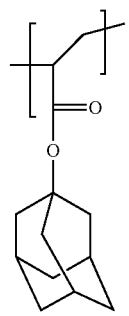

[Formula 7-2]
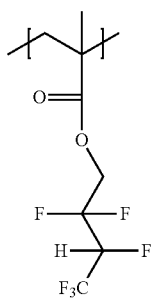

[Formula 7-3]

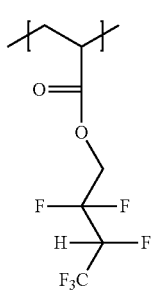

[Formula 7-4]

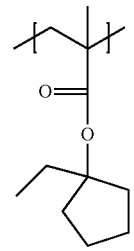

[Formula 7-5]

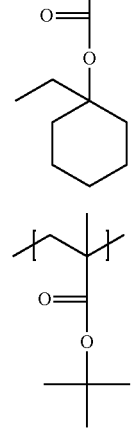

[Formula 7-6]

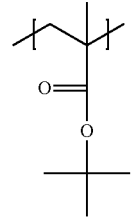

As described above, the polymer may be a copolymer having repeating units selected from the repeating units represented by Formulas 4, 5, 6, and 7.

Examples of the polymer according to an aspect of the present invention include at least one selected from Polymer 1 including 100 parts by mole of a repeating unit represented by Formula 4-1 and 10 to 100 parts by mole of a repeating unit represented by Formula 7-2; Polymer 2 including 100 parts by mole of a repeating unit represented by Formula 4-1 and 10 to 100 parts by mole of a repeated unit represented by Formula 5-2; Polymer 3 including 100 parts by mole of a repeating unit represented by Formula 4-1, 10 to 100 parts by mole of a repeated unit represented by Formula 5-4, and 10 to 100 parts by mole of a repeated unit represented by Formula 7-6; Polymer 4 including 100 parts by mole of a repeating unit represented by Formula 5-2 and 10 to 100 parts by mole of a repeated unit represented by Formula 5-5; Polymer 5 including 100 parts by mole of a repeating unit represented by Formula 5-3 and 10 to 100 parts by mole of a repeated unit represented by Formula 6-1; and Polymer 6 including 100 parts by mole of a repeating unit represented by Formula 5-4 and 10 to 100 parts by mole of a repeated unit represented by Formula 5-5.

[Polymer 1]

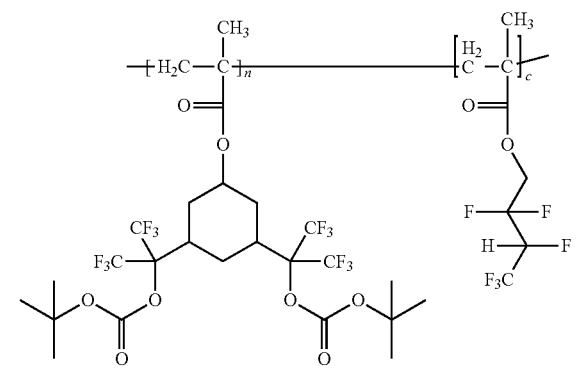

In the formula of Polymer 1, a is 100 parts by mole, and c is 10 to 900 parts by mole.

[Polymer 2]

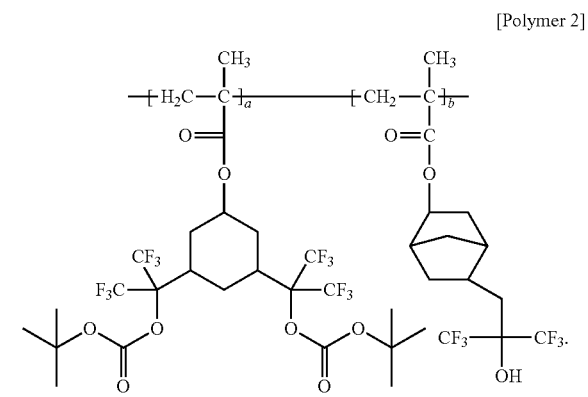 [SMILES: CCC(C)(CC(C)(C)C(=O)OC1CC2CC1CC2CC(O)(C(F)(F)F)C(F)(F)F)C(=O)OC1CC(C(OC(=O)OC(C)(C)C)(C(F)(F)F)C(F)(F)F)CC(C(OC(=O)OC(C)(C)C)(C(F)(F)F)C(F)(F)F)C1]

In the formula of Polymer 2, a is 100 parts by mole, and b is 10 to 900 parts by mole.

[Polymer 3]

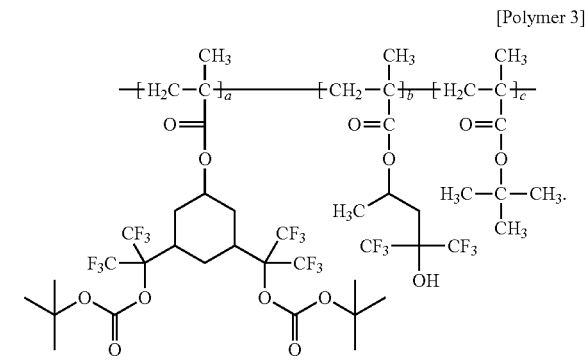 [SMILES: CCC(C)(CC(C)(CC(C)(C)C(=O)OC(C)(C)C)C(=O)OC(C)CC(O)(C(F)(F)F)C(F)(F)F)C(=O)OC1CC(C(OC(=O)OC(C)(C)C)(C(F)(F)F)C(F)(F)F)CC(C(OC(=O)OC(C)(C)C)(C(F)(F)F)C(F)(F)F)C1]

In the formula of Polymer 3, a is 100 parts by mole, b is 10 to 900 parts by mole, and c is 10 to 900 parts by mole.

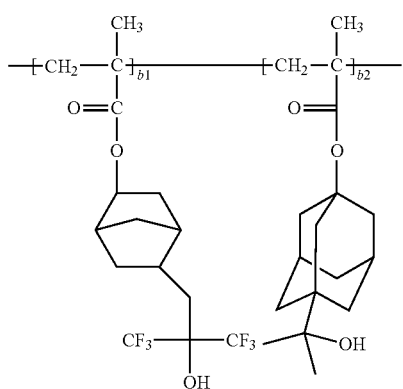

[Polymer 4]

In the formula of Polymer 4, $b_1$ is 100 parts by mole, and $b_2$ is 10 to 900 parts by mole.

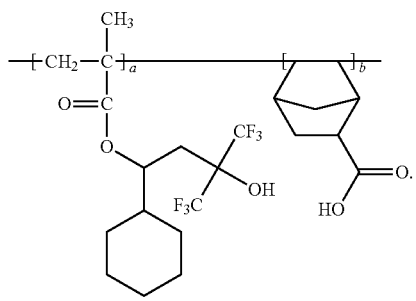

[Polymer 5]

In the formula of Polymer 5, a is 100 parts by mole, and b is 10 to 900 parts by mole.

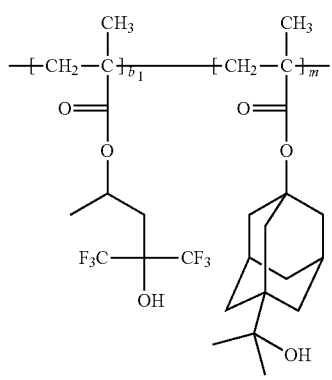

[Polymer 6]

In the formula of Polymer 6, $b_1$ is 100 parts by mole, and $b_2$ is 10 to 900 parts by mole.

In particular, the polymer includes a polymer selected from Polymer 1, Polymer 4, and Polymer 6.

In another embodiment, the polymer includes one of Polymer 2 and Polymer 3, and one of Polymer 5 and Polymer 6.

In this regard, it is obvious to one of ordinary skill in the art that repeating units of the polymers represented by formulas of Polymers 1 to 6 are not configured in the order as illustrated below and the polymer compound includes all the polymer compounds in the form of a random copolymer whose repeating units are randomly arranged:

The substituents used in the definition of the polymer compound may be defined as follows.

The alkyl group as used herein refers to a linear or branched saturated monovalent hydrocarbon group having 1 to 20 carbon atoms, for example, 1 to 10 carbon atoms, for example, 1 to 6 carbon atoms. Examples of the unsubstituted alkyl group include methyl, ethyl, propyl, isobutyl, sec-butyl, tert-butyl, pentyl, iso-amyl, and hexyl, and at least one hydrogen atom of the unsubstituted alkyl group may be substituted with a halogen atom, a hydroxyl group, a nitro group, a cyano group, a substituted or unsubstituted amino group (e.g., —$NH_2$, —NH(R), —N(R')(R") wherein R' and R" are each independently a, $C_1$-$C_{10}$ alkyl group), an amidino group, hydrazine, hydrazone, a carboxyl group, a sulfonic acid group, a phosphoric acid group, a $C_1$-$C_{20}$ alkyl group, a $C_1$-$C_{20}$ halogenated alkyl group, a $C_1$-$C_{20}$ alkenyl group, a $C_1$-$C_{20}$ alkynyl group, a $C_1$-$C_{20}$ heteroalkyl group, a $C_6$-$C_{20}$ aryl group, a $C_6$-$C_{20}$ arylalkyl group, a $C_6$-$C_{20}$ heteroaryl group, or a $C_6$-$C_{20}$ heteroarylalkyl group.

The alkylene group as used herein refers to a straight or branched chain divalent hydrocarbon group that only consists of carbon and hydrogen; has no degree of unsaturation, and has 1 to 10 carbon atoms, for example, 1 to 5 carbon atoms. Examples of the alkylene group include methylene, ethylene, propylene, and n-butylene. At least one hydrogen atom of the alkylene group may be substituted with the same substituent as in the alkyl group described above.

A substituent, i.e., a cyclic alkylene group as used herein includes a polycyclic alkylene group. At least one hydrogen atom included in the cyclic alkylene group may be substituted with the same substituent as in the case of the alkyl group described above.

The amount of the polymer may be 1 to 20 parts by weight, for example, 1 to 15 parts by weight, for example, 1 to 10 parts by weight based on 100 parts by weight of the solvent. When the amount of the polymer compound is within this range, a composition including the polymer has an appropriate viscosity for forming a resist protective film and the thickness of the resist protective film may be easily adjusted.

The resist protective film composition for lithography process may further include at least one of an acid-generating compound and an acid compound to improve the performance of lithography.

First, the radiation-sensitive acid-generating compound may be any compound that is generally used to improve lithography performance of a resist and examples of the radiation-sensitive acid-generating compound include a sulfone imide compound, a sulfone compound, a sulfonic acid ester compound, and diazomethane compound.

The acid compound may be, for example, carboxylic acids or sulfonic acids. In particular, the acid compound may be at least one selected from 2,4-difluorophenyl acetic acid, 3,5-difluorophenyl acetic acid, 3,5-bis(trifluoromethyl)phenyl acetic acid, 3-fluoro-4-hydroxyphenyl acetic acid, (2,5-dimethoxyphenyl)acetic acid, 4-hydroxy-3-nitrophenyl acetic acid, 2,3,4,5,6-pentafluorophenyl acetic acid, 1-naphthyl acetic acid, 2-naphthyl acetic acid, (1-naphthoxy)acetic acid, (2-naphthoxy)acetic acid, 2-fluorobenzic acid, 2-trifluoromethylbenzoic acid, 2-nitrobenzoic acid, 3-fluorobenzoic acid, 3-trifluoromethylbenzoic acid, 3-methoxybenzoic acid, 4-fluorobenzoic acid, 4-trifluoromethylbenzoic acid, 4-nitrobenzoic acid, 3-fluoro-2-methylbenzoic acid, 2,3-difluorobenzoic acid, 2,6-difluorobenzoic acid, 2-fluoro-6-trifluoromethylbenzoic acid, 2-fluoro-3-trifluoromethylbenzoic acid, 2,6-bis(trifluoromethyl)benzoic acid, 2-methyl-6-nitrobenzoic acid, 3-methyl-2-nitrobenzoic acid, 2-methyl-3-nitrobenzoic acid, 5-fluoro-2-methylbenzoic acid, 3-fluoro- 4-methylbenzoic acid, 2,4-bis(trifluoromethyl)benzoic acid, 2,5-bis(trifluoromethyl)benzoic acid, 2,4-difluorobenzoic acid, 3,4-difluorobenzoic acid, 2-fluoro-4-trifluoromethylbenzoic acid, 2,5-difluorobenzoic acid, 3-fluoro-4-methoxybenzoic acid, 5-methyl-2-nitrobenzoic acid, 4-methyl-3-nitrobenzoic acid, 3-methyl-4-nitrobenzoic acide, 2-methyl-5-nitrobenzoic acidic acid, 2-fluoro-5-nitrobenzoic acid, 4-fluoro-3-nitrobenzoic acid, 4-methoxy-3-nitrobenzoic acid, 3-methoxy-4-nitrobenzoic acid, 3-hydroxy-4-nitrobenzoic acid, 2-hydroxy-5-nitrobenzoic acid, 2,4-dinitrobenzoic acid, 3,4-dinitrobenzoic acid, 3,5-difluorobenzoic acid, 3,5-bis(trifluoromethyl)benzoic acid, 3,5-dinitrobenzoic acid, 2,3,4-trifluorobenzoic acid, 2,3,6-trifluorobenzoic acid, 2,4,6-trifluorobenzoic acid, 3,4,5-trifluorobenzoic acid, 4-methyl-3,5-dinitrobenzoic acid, 4-hydroxy-3,5-dinitrobenzoic acid, 3,5-dinitrosalicylic acid, 2,4,5-trifluorobenzoic acid, 2,3,4,5-tetrafluorobenzoic acid, 2,3,5,6-tetrafluorobenzoic acid, 2,3,5,6-tetrafluoro-4-methylbenzoic acid, pentafluorobenzoic acid, 2,3,4,5,6-pentafluorophenoxyacetic acid, 1-naphthalenecarboxylic acid, 2-naphthalenecarboxylic acid, 4-fluoro-1-naphthalenecarboxylic acid, 1-hydroxy-2-naphthalenecarboxylic acid, 2-hydroxy-1-naphthalenecarboxylic acid, 3-hydroxy-2-naphthalenecarboxylic acid, 1,4-dihydroxy-2-naphthalenecarboxylic acid, 3,5-dihydroxy-2-naphthalenecarboxylic acid, 1,4-naphthalenedicarboxylic acid, 2,3-naphthalenedicarboxylic acid, 2,6-naphthalenedicarboxylic acid, methanesulfonic acid, ethanesulfonic acid, taurine, 3-[(1,1-dimethyl-2-hydroxyethyl)amino]-2-hydroxy-1-propanesulfonic acid, 3-[bis(2-hydroxyethyl)amino]-2-hydroxy-1-propanesulfonic acid, (1R)-(−)-10-camphorsulfonic acid, (1S)-(+)-10-camphorsulfonic acid, trifluoromethylsulfonate, perfluorobutanesulfonic acid, perfluorooctanesulfonic acid, (methylamino)sulfonic acid, (butylamino)sulfonic acid, 1,1,2,2-tetrafluoro-2-(tetracyclo[4.4.0.12,5.17,10]dodecane-8-yl)ethanesulfonic acid, 1,1-difluoro-2-(tetracyclo[4.4.0.12,5.17,10]dodecane-8-yl)ethanesulfonic acid, dodecyl benzene sulfonic acid, nonafluoro butane sulfonic acid, 1-naphthoic acid, 3-hydroxy-2-naphthoic acid, and lactic acid.

The acid-generating compound and the acid compound each may be used alone or in combination of at least two of these compounds.

The amount of each of the acid-generating compound and the acid compound may be 0.001 to 10 parts by weight, for example, 0.003 to 5 parts by weight, for example, 0.005 to 3 parts by weight based on 100 parts by weight of the polymer. When the amount of each of the acid-generating compound and the acid compound is within this range, a resist pattern is uniformly formed and line edge roughness characteristic of the polymer compound may be improved.

According to another embodiment of the present invention, a method of forming a pattern of a semiconductor device by using the resist protective film composition according to an embodiment of the present invention may use a general liquid immersion lithography process, and the method may include, for example, (i) spin-coating the resist protective film composition on an etched layer (a substrate) to form a photoresist layer having a thickness of, for example, 10 to 100 nm, (ii) baking the resist protective film composition on the substrate at a temperature of, for example, 80 to 100° C. for 60 to 100 seconds to form a resist protective film, (iii) performing a liquid immersion lithography on the photoresist layer, on which the resist protective film, is formed, by using, for example, 193 nm ArF liquid immersion lithography equipment (ASML 1900i), followed by post-baking the resultant at a temperature of, for example, 80 to 100° C. for 60 to 100 seconds, (iv) developing the post-baked photoresist layer by using a developer (for example, an 2.38 wt % aqueous tetramethylammonium hydroxide (TMAH) solution) to form a predetermined photoresist pattern, and (v) etching the etched layer by using the photoresist pattern as an etching mask to form an etched layer pattern.

Hereinafter, the method of forming a pattern of a semiconductor device by using the resist protective film composition according to an embodiment of the present invention will be described in detail.

First, in the spin-coating of the resist protective film composition on a substrate to form a photoresist layer, the substrate may be, for example, a silicon wafer or a wafer coated with aluminum. The photoresist is not particularly limited, but an appropriate photoresist may be selected according to its use.

The photoresist layer is formed by dissolving a resin for forming a photoresist layer in an appropriate solvent, filtering to prepare a resist composition, coating the resist composition on a substrate by using an appropriate coating method, and baking the resultant to evaporate the solvent.

The forming of the resist protective film composition on the substrate to form a resist protective film generally includes coating the resist protective film composition of the present invention on the photoresist layer and post-baking the resultant. The process is included to form a resist protective film for protecting the photoresist layer, and the resist protective layer protects the photoresist layer, and prevents contamination of a lens of a transparent lithography equipment that may be caused by a component contained in the resist of the photoresist layer.

In the process, the baking and the post-baking are each performed at a temperature of, for example, 80 to 100° C. for 60 to 100 seconds.

As the thickness of the resist protective film comes close to an odd multiple of $\lambda/4n$ ($\lambda$ is the wavelength of radiation and n is a refractive index of the resist protective film), an inhibiting effect of reflection at an upper interface of a resist film increases. Thus, the thickness of the resist protective film may approximate this value. In addition, any one of the pre-sintering process after the coating of the resist solution and the sintering process after the coating of the resist protective film composition may not be performed to simplify manufacturing processes.

The arranging of the immersion medium between the resist protective film and a lens, the irradiating of the radiation to the photoresist film and the resist protective film via the immersion medium and a mask with a predetermined pattern, and the developing of the irradiated films to form a resist pattern include performing light-exposure, for example, immersion lithography on the photoresist film and the resist protective film, sintering the films at a predetermined temperature, and developing the sintered films.

The pH of the immersion medium arranged between the photoresist layer and resist protective film may be adjusted, and, in particular, the immersion medium therebetween may be pure water.

The radiation used in the immersion lithography may be selected from visible rays; ultraviolet rays such as g-rays and i-rays; far-ultraviolet rays such as an excimer laser; X-rays such as synchrotron radiation; and charged particle beams such as electro beams, according to the used photoresist film and a combination of the photoresist film and the resist protective film for immersion. In particular, the radiation may be an ArF excimer laser (wavelength: 193 nm) or a KrF excimer laser (wavelength: 248 nm).

In addition, to improve resolution, pattern shape, and developing properties of a resist film, a sintering process may be performed after exposure to light. The sintering temperature may be appropriately adjusted according to a resist and may be generally in the range of about 30 to 200° C., for example, in the range of 50 to 150° C.

The photoresist film is developed using a developer and washed to from a desired resist pattern. In this case, the resist protective film for an immersion lithography process does not need to be peeled off and is completely removed during the developing process or the washing process after the developing process. This is one of main characteristics of the embodiments of the present invention.

Examples of the developer used to form a resist pattern may include aqueous alkaline solutions obtained by dissolving sodium hydroxide, potassium hydroxide, sodium carbonate, sodium silicate, sodium metasilicate, ammonia, ethyl amine, n-propyl amine, diethyl amine, di-n-propyl amine, triethyl amine, methyl diethyl amine, dimethyl ethanol amine, triethanol amine, tetramethyl ammonium hydroxide, tetraethyl ammonium hydroxide, pyrrole, piperidine, choline, 1,8-diazabicyclo-[5,4,0]-7-undecene, and 1,5-diazabicyclo-[4,3,0]-5-nonane, respectively. In addition, an appropriate amount of an aqueous organic solvent, for example, alcohol such as methanol or ethanol or a surfactant may be added to the developer. When a developing process is performed using the aqueous alkaline solution, the developing process is generally followed by a washing process.

The developer may be, for example, a 2.38 wt % tetramethylammonium hydroxide (TMAH) aqueous solution.

One or more embodiments of the present invention will now be described in greater detail with reference to the following examples. However, these examples are for illustrative purpose only and are not intended to limit the scope of the invention.

Preparation Example 1

Preparation of Polymer 1

79.86 g (0.114 mol) of the monomer having a repeating unit represented by Formula 4-1, 19.01 g (0.076 mol) of the monomer having a repeating unit represented by Formula 7-2, and 17.30 g of an azobis(isobutyronitrile) (AIBN) initiator were added into a 1,000 ml round-bottom flask, and 296 g of THF was added to the resultant to obtain a mixture.

Thereafter, a reaction temperature of the mixture was maintained at 70° C. and maintained for 12 hours to induce a reaction therebetween. After the reaction was terminated, the reaction product was precipitated in 6,000 ml of heptane, and the precipitate was dried in a vacuum oven at 40° C. for 24 hours. Thereafter, the dried precipitate was dissolved in ether and further precipitated in 5,000 ml of heptane. The reprecipitated polymer was collected and dried in a vacuum oven at 40° C. for 24 hours to obtain 75 g of a polymer including 0.1114 parts by mole of a repeating unit represented by Formula 4-1 and 0.076 parts by mole of a repeating unit represented by Formula 7-2 (yield: 75.9%, weight average molecular weight (Mw): 8240, PDI (polydispersity index): 2.19).

Preparation Example 2

Preparation of Polymer 2

70 g of Polymer 2 (yield: 69.2%, Mw:8970, PDI:2.28) including 0.128 parts by mole of a repeating unit represented by Formula 4-1 and 0.032 parts by mole a repeating unit represented by Formula 5-2 was prepared in the same manner as in Preparation Example 1, except that 89.67 g (0.128 mol) of the monomer having a repeating unit of Formula 4-1, 11.53 g (0.032 mol) of the monomer having a repeating unit of Formula 5-2, 17.71 g of an AIBN initiator, and 303 g of THF were used instead of the components used in Preparation Example 1.

Preparation Example 3

Preparation of Polymer 3

79 g of Polymer 3 (yield: 76.7%, Mw:8030, PDI:2.03) including 0.098 parts by mole of a repeating unit represented by Formula 4-1, 0.056 parts by mole a repeating unit represented by Formula 5-4, 0.126 parts by mole a repeating unit represented by Formula 7-6 and was prepared in the same manner as in Preparation Example 1, except that 68.65 g (0.098 mol) of the monomer having a repeating unit of Formula 4-1, 16.47 g (0.056 mol) of the monomer having a repeating unit of Formula 5-4, 17.92 g (0.126 mol) of the monomer having a repeating unit of Formula 7-6, 18.03 g of an AIBN initiator, and 309 g of THF were used instead of the components used in Preparation Example 1.

Preparation Example 4

Preparation of Polymer 4

80 g of Polymer 4 (yield: 79.4%, Mw:7890, PDI:2.24) including 0.210 parts by mole of a repeating unit represented by Formula 5-2 and 0.090 parts by mole a repeating unit represented by Formula 5-5 and was prepared in the same manner as in Preparation Example 1, except that 75.66 g (0.210 mol) of the monomer having a repeating unit of Formula 5-2, 25.06 g (0.090 mol) of the monomer having a repeating unit of Formula 5-5, 17.63 g of an AIBN initiator, and 302 g of THF were used instead of the components used in Preparation Example 1.

Preparation Example 5

Preparation of Polymer 5

69 g of Polymer 5 (yield: 66.8%, Mw:8100, PDI:2.31) including 0.245 parts by mole of a repeating unit represented by Formula 5-3 and 0.105 parts by mole a repeating unit represented by Formula 6-1 and was prepared in the same manner as in Preparation Example 1, except that 88.77 g (0.245 mol) of the monomer having a repeating unit of Formula 5-3, 14.51 g (0.105 mol) of the monomer having a repeating unit of Formula 6-1, 18.07 g of an AIBN initiator, and 309 g of THF were used instead of the components used in Preparation Example 1.

Preparation Example 6

Preparation of Polymer 6

77 g of Polymer 6 (yield: 76.0%, Mw:8230, PDI:2.21) including 0.245 parts by mole of a repeating unit represented by Formula 5-4 and 0.105 parts by mole a repeating unit represented by Formula 5-5 and was prepared in the same manner as in Preparation Example 1, except that 72.08 g (0.245 mol) of the monomer having a repeating unit of Formula 5-4, 29.23 g (0.105 mol) of the monomer having a repeating unit of Formula 5-5, 17.73 g of an AIBN initiator, and 303 g of THF were used instead of the components used in Preparation Example 1.

Polymerization conditions of the polymers prepared in Preparation Examples 1 to 6 are shown in Table 1 below.

TABLE 1

| | Formula of repeating unit of monomer | | | Mixing ratio (molar ratio) | Reaction solvent | Yield (%) | MW | PDI |
|---|---|---|---|---|---|---|---|---|
| Polymer 1 | 4-1 (0.114 mol) | 7-2 (0.076 mol) | | 60:40 | THF | 75.9 | 8240 | 2.19 |
| Polymer 2 | 4-1 (0.128 mol) | 5-2 (0.032 mol) | | 80:20 | THF | 69.2 | 8970 | 2.28 |
| Polymer 3 | 4-1 (0.098 mol) | 5-4 (0.056 mol) | 7-6 (0.126 mol) | 35:20:45 | THF | 76.7 | 8030 | 2.03 |
| Polymer 4 | 5-2 (0.210 mol) | 5-5 (0.090 mol) | | 70:30 | THF | 79.4 | 7890 | 2.24 |
| Polymer 5 | 5-3 (0.245 mol) | 6-1 (0.105 mol) | | 70:30 | THF | 66.8 | 8100 | 2.31 |
| Polymer 6 | 5-4 (0.245 mol) | 5-5 (0.105 mol) | | 70:30 | THF | 76.0 | 8230 | 2.21 |

Examples 1 to 16

Preparation of Resist Protective Films

A photoresist solution (Product Name: DHA-3606, manufactured by DONGJIN SEMICHEM) was coated on a silicon (Si) substrate, and the coated Si substrate was baked at 110° C. for 60 seconds to form a resist film (a photoresist layer) having a thickness of 150 nm.

Referring to a composition shown in Table 2 below, 3 parts by weight of Polymer resin (A), which is a blended compound of A1 and A2 that were obtained using Polymers 1 to 6 according to Preparation Examples 1 to 6, was added to 97 parts by weight of a mixed solvent, i.e., an organic solvent (C) of C1, i.e., the material having a Hildebrand solubility parameter ($\delta$) of 12.5 to 22.0; C2, i.e., 1,1-diethoxypropane (EP); and C3, i.e., 2-heptanol (2-H). Then, the mixture was dissolved by stirring at room temperature for 4 hours, to form resist protective films according to Examples 1 to 16.

The resist protective film-forming compositions prepared according to Preparation Example 1 to 16 were each spin-coated on the resist films, and the coated resist films were baked at a temperature of 90° C. for 60 seconds to form resist protective films of which has a thickness of 50 nm Here, C1-A refers to 2,5-dimethyltetrahydrofuran, C1-B refers to 2,4-dimethyl-3-pentanone, C1-C refers to methyl hexanoate, and C1-D refers to 1,2-epoxypropane.

Here, an additive (B) used in the resist protective film was ethane sulfonic acid in Example 7, and an amount of the ethane sulfonic acid was 0.1 parts by weight.

Comparative Examples 1 to 7

Preparation of Resist Protective Films

A resist protective film was formed in the same manner used in Example 1, except that a mixture solvent having a composition shown in Table 2 was used instead of 97 parts by weight of the mixture solvent, i.e., an organic solvent (C) of C1, i.e., the material having a Hildebrand solubility parameter ($\delta$) of 12.5 to 22.0; C2, i.e., 1,1-diethoxypropane (EP); and C3, i.e., 2-heptanol (2-H).

C1-E in Comparative Example 1 was perfluorohexane, C1-F in Comparative Example 2 was propylene carbonate, C1-A in Comparative Example 3 was 2,2,4,4-tetramethyl-3-pentanone, and C1-D in Comparative Examples 6 and 7 was cyclopropyl methyl ketone.

In particular, the types of polymer compounds and the amount of the additive used in Examples 1 to 16 and Comparative Examples 1 to 7 are shown in Table 2 below.

TABLE 2

| | Polymer resin (A) | | | | Organic solvent (C) | | | |
|---|---|---|---|---|---|---|---|---|
| | A1 | A2 | A1:A2 (weight ratio) | Additive (B) B | C1 ($\delta$) | C2 | C3 | C1:C2:C3 (weight ratio) |
| Example 1 | Polymer 1 | Polymer 4 | 15:85 | None | C1-A (16.5) | EP | 2-H | 15:65:20 |
| Example 2 | Polymer 2 | Polymer 5 | 15:85 | None | C1-A (16.5) | EP | 2-H | 15:65:20 |
| Example 3 | Polymer 3 | Polymer 6 | 15:85 | None | C1-A (16.5) | EP | 2-H | 15:65:20 |
| Example 4 | Polymer 1 | Polymer 6 | 20:80 | None | C1-A (16.5) | EP | 2-H | 15:65:20 |
| Example 5 | Polymer 1 | Polymer 4 | 15:85 | None | C1-A (16.5) | EP | 2-H | 100:0:0 |
| Example 6 | Polymer 1 | Polymer 4 | 15:85 | None | C1-A (16.5) | EP | 2-H | 80:10:10 |
| Example 7 | Polymer 1 | Polymer 4 | 15:85 | Ethanesulfonic acid | C1-A (16.5) | EP | 2-H | 15:65:20 |
| Example 8 | Polymer 1 | Polymer 4 | 15:85 | None | C1-B (16.5) | EP | 2-H | 15:65:20 |

TABLE 2-continued

| | Polymer resin (A) | | | Additive (B) | Organic solvent (C) | | | |
|---|---|---|---|---|---|---|---|---|
| | A1 | A2 | A1:A2 (weight ratio) | B | C1 (δ) | C2 | C3 | C1:C2:C3 (weight ratio) |
| Example 9 | Polymer 1 | Polymer 4 | 15:85 | None | C1-B (16.5) | EP | 2-H | 30:50:20 |
| Example 10 | Polymer 1 | Polymer 4 | 15:85 | None | C1-B (16.5) | EP | 2-H | 50:30:20 |
| Example 11 | Polymer 1 | Polymer 4 | 15:85 | None | C1-C (17.6) | EP | 2-H | 15:65:20 |
| Example 12 | Polymer 1 | Polymer 4 | 15:85 | None | C1-C (17.6) | EP | 2-H | 15:55:30 |
| Example 13 | Polymer 1 | Polymer 4 | 15:85 | None | C1-D (19.2) | EP | 2-H | 15:65:20 |
| Example 14 | Polymer 1 | Polymer 4 | 15:85 | None | C1-D (19.2) | EP | 2-H | 10:75:20 |
| Example 15 | polymer 1 | polymer 4 | 15:85 | None | C1-D (19.2) | EP | — | 10:90:0 |
| Example 16 | polymer 1 | polymer 4 | 15:85 | None | C1-D (19.2) | — | 2-H | 10:0:90 |
| Comparative Example 1 | Polymer 3 | Polymer 5 | 15:85 | None | C1-E (11.9) | EP | 2-H | 15:65:20 |
| Comparative Example 2 | Polymer 1 | Polymer 4 | 15:85 | None | C1-F (27.2) | EP | 2-H | 15:65:20 |
| Comparative Example 3 | Polymer 1 | Polymer 4 | 15:85 | None | C1-A (16.5) | EP | 2-H | 5:5:90 |
| Comparative Example 4 | Polymer 1 | Polymer 4 | 15:85 | None | None | EP | 2-H | 0:90:10 |
| Comparative Example 5 | Polymer 1 | Polymer 4 | 15:85 | None | None | EP | 2-H | 0:50:50 |
| Comparative Example 6 | Polymer 1 | Polymer 4 | 15:85 | None | C1-D (19.2) | EP | — | 5:95:0 |
| Comparative Example 7 | Polymer 1 | Polymer 4 | 15:85 | None | C1-D (19.2) | — | 2-H | 95:0:5 |

Evaluation Example 1

Evaluation of Coating Compactness of Resist Protective Film

A resist protective film composition was spin-coated on a silicon (Si) substrate and baked at 90° C. for 60 seconds to prepare a resist protective film having a thickness of 45 nm. Then, a thickness was obtained by measuring a thickness of 40 points portion of the resist protective film while maintaining a constant interval in a direction of X-axis of the substrate by using a thickness measuring equipment (Equipment Name: OP2600, available from SYSTEM), and a standard deviation thereof was calculated. The smaller the value of the standard deviation is, the better coating compactness the resist protective film has.

Evaluation Example 2

Contact Angle Evaluation of Resist Protective Film

To evaluate a contact angle of a resist protective film, a receding contact angle and an advancing contact angle of a wafer with a resist protective film formed thereon were evaluated using a contact angle device (device name: DSA-100, manufacturer: KRUSS) according to a general method disclosed in a paper (Burnett et al., J. Vac. Sci. Techn. B, 23(6), Pages 2721-2727 (November/December 2005)).

Evaluation Example 3

Measurement of Film Thickness after Developing TMAH

This experiment was performed to evaluate whether the resist protective film was removed after light exposure. A resist protective film was formed to a thickness of 100 nm and developed using 2.38 wt % of an aqueous tetramethylammoniumhydroxide (TMAH) solution for 10 seconds and whether the resist protective film was removed was evaluated by measuring the thickness of the resist protective film.

Evaluation Example 4

Measurement of the Number of Particles in the Resist Protective Film after Coating of Resist Protective Film This experiment was performed to measure a degree of defect generated while coating a resist protective film. A resist protective film composition was spin-coated on a silicon (Si) substrate and baked at 90° C. for 60 seconds to prepare a resist protective film having a thickness of 45 nm. Then, a surface measuring equipment (Equipment Name: EXP-1200, available from NEGEVTECH) was used to measure the number of particles in the resist protective film. As the number of the particles was smaller, a thickness deviation of the resist protective film is smaller, and thus the resist protective film has excellent coating compactness.

TABLE 3

| | Receding contact angle (°) | Advancing contact angle (°) | Coating compactness (standard deviation) | Thickness of the resist protective film after development using TMAH (nm) | The number of particles in resist protective film |
|---|---|---|---|---|---|
| Example 1 | 76 | 92 | 0.5 | 0 | 13 |
| Example 2 | 75 | 90 | 0.4 | 0 | 8 |
| Example 3 | 75 | 91 | 0.5 | 0 | 5 |
| Example 4 | 76 | 93 | 0.4 | 0 | 10 |
| Example 5 | 76 | 92 | 0.3 | 0 | 9 |
| Example 6 | 76 | 92 | 0.4 | 0 | 6 |
| Example 7 | 76 | 92 | 0.6 | 0 | 11 |
| Example 8 | 76 | 92 | 0.4 | 0 | 3 |
| Example 9 | 76 | 92 | 0.5 | 0 | 4 |
| Example 10 | 76 | 92 | 0.5 | 0 | 11 |
| Example 11 | 76 | 92 | 0.5 | 0 | 7 |
| Example 12 | 76 | 92 | 0.4 | 0 | 12 |
| Example 13 | 76 | 92 | 0.5 | 0 | 10 |
| Example 14 | 76 | 92 | 0.6 | 0 | 4 |
| Example 15 | 76 | 92 | 0.6 | 0 | 13 |
| Example 16 | 76 | 92 | 0.5 | 0 | 10 |
| Comparative Example 1 | 75 | 91 | 6.2 | 40 | 245 |
| Comparative Example 2 | 76 | 92 | 6.8 | 35 | 312 |
| Comparative Example 3 | 76 | 92 | 7.0 | 20 | 643 |
| Comparative Example 4 | 76 | 92 | 6.4 | 0 | 405 |
| Comparative Example 5 | 76 | 92 | 7.2 | 0 | 742 |
| Comparative Example 6 | 76 | 92 | 8.1 | 0 | 324 |
| Comparative Example 7 | 76 | 92 | 5.2 | 0 | 845 |

As shown in Table 3, when one of the resist protective films prepared in Examples 1 to 16 is used, coating compactness of the resist protective film increased, and thus coating defect of the resist protective film reduced. On the other hand, the resist protective films prepared in Comparative Examples 1 to 7 using a solvent with a δ value off a predetermined range has no improvement in the evaluation results of the coating compactness of the resist protective film and the coating defect of the resist protective film.

INDUSTRIAL APPLICABILITY

According to one or more embodiments of the present invention, a resist protective film composition for lithography has improved coating compactness, and when the composition is used in a lithography process while performing the coating, a resist protective film having increased compactness and decreased coating defect may be obtained.

The invention claimed is:

1. A resist protective film composition for lithography, the composition comprising:
a polymer having a weight average molecular weight of 2,000 to 100,000 comprising a repeating unit having a fluorine-containing functional group at a side chain of the polymer; and
a solvent,
wherein the solvent comprises a material which makes up 10 to 90 parts by weight based on 100 parts by weight of the total weight of the solvent;
the material is at least one selected from 2,5-dimethyltetrahydrofuran, methyl hexanoate, 1,2-epoxypropane, 4-methyl-1,3-dioxane, 2-methoxy-1,3-dioxane, 2-ethyl-2-methyl-1,3-dioxane, dibutyl adipate, isoamyl acetate, cyclohexyl acetate, ethyl 3-oxohexanoate, 2,2,4,4-tetramethyl-3-pentanone, 2,4-dimethyl-3-pentanone, 4-heptanone, cyclopropyl methyl ketone, 3,3-dimethyl-2-butanone, and butyl acetate, and the polymer is at least one selected from Polymer 1; Polymer 2; Polymer 3; Polymer 4; Polymer 5; and Polymer 6:

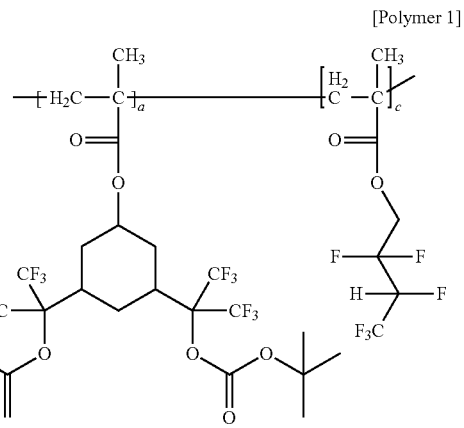

[Polymer 1]

in the formula of Polymer 1, a is 100 parts by mole, and c is 10 to 900 parts by mole,

[Polymer 2]

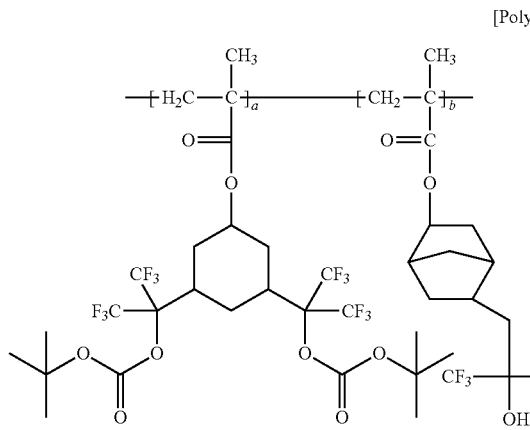

in the formula of Polymer 2, a is 100 parts by mole, and b is 10 to 900 parts by mole,

[Polymer 3]

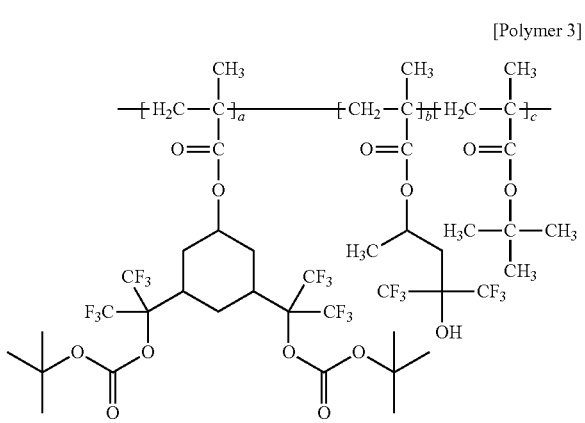

in the formula of Polymer 3, a is 100 parts by mole, b is 10 to 900 parts by mole, and c is 10 to 900 parts by mole,

[Polymer 4]

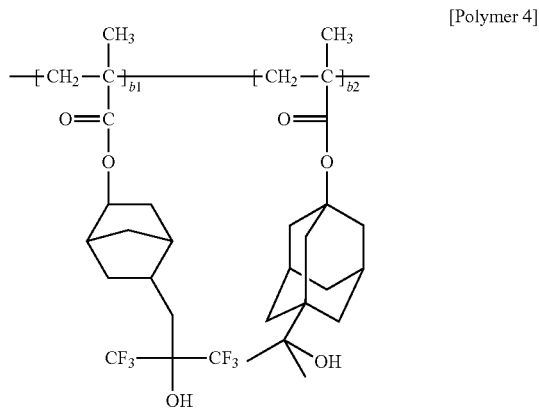

in the formula of Polymer 4, $b_1$ is 100 parts by mole, and $b_2$ is 10 to 900 parts by mole,

[Polymer 5]

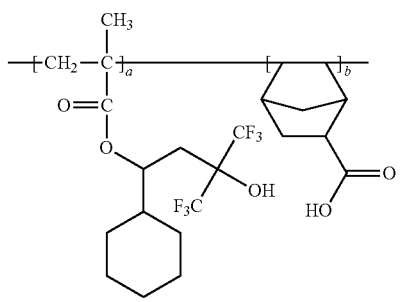

in the formula of Polymer 5, a is 100 parts by mole, and b is 10 to 900 parts by mole,

[Polymer 6]

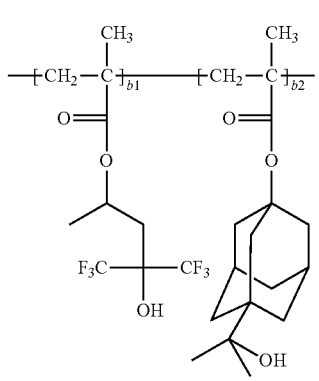

in the formula of Polymer 6, $b_1$ is 100 parts by mole, and $b_2$ is 10 to 900 parts by mole.

2. The resist protective film composition of claim 1, wherein the solvent further comprises at least one selected from an alkoxyalkane solvent and an alcohol solvent.

3. The resist protective film composition of claim 2, wherein an amount of the alkoxyalkane solvent is 10 to 1000 parts by weight based on 100 parts by weight of the material and an amount of the alcohol solvent is 10 to 1000 parts by weight based on 100 parts by weight of the material.

4. The resist protective film composition of claim 2, wherein the alcohol solvent is a C4-C11 monovalent alcohol, a C4-C11 divalent alcohol, or a C4-C20 polyvalent alcohol.

5. The resist protective film composition of claim 2, wherein the alkoxyalkane solvent is a C3-C16 dialkoxyalkane, trialkoxyalkane, or tetraalkoxyalkane.

6. The resist protective film composition of claim 1, wherein an amount of the polymer is 1 to 20 parts by weight based on 100 parts by weight of the solvent.

7. The resist protective film composition of claim 1 further comprising at least one of an acid-generating compound and an acid compound, wherein an amount of the at least one of an acid-generating compound and an acid compound is 0.001 to 10 parts by weight based on 100 parts by weight of the polymer.

8. A method of forming a pattern of a semiconductor device, the method comprising:
coating a resist protective film composition for lithography on a photoresist layer formed on a substrate, the resistive protective film composition for lithography comprising a polymer having a weight average molecular weight of 2,000 to 100,000 comprising a repeating unit having a fluorine-containing functional group at a side chain of the polymer; and a solvent,
wherein the solvent comprises a material which makes up 10 to 90 parts by weight based on 100 parts by weight of the total weight of the solvent;
baking the resist protective film composition for lithography to form a resist protective film;
post-baking the photoresist layer, on which the resist protective film is formed, after performing a liquid immersion lithography process;
developing the post-baked photoresist layer by using a developer to form a predetermined photoresist pattern on the substrate; and
etching a to-be etched layer by using the photoresist pattern as an etching mask to form a etched layer pattern;
wherein the material is at least one selected from 2,5-dimethyltetrahydrofuran, methyl hexanoate, 1,2-epoxypropane, 4-methyl-1,3-dioxane, 2-methoxy-1,3-dioxane, 2-ethyl-2-methyl-1,3-dioxane, dibutyl adipate, isoamyl acetate, cyclohexyl acetate, ethyl 3-oxohexanoate, 2,2,4,4-tetramethyl-3-pentanone, 2,4-dimethyl-3-pentanone, 4-heptanone, cyclopropyl methyl ketone, 3,3-dimethyl-2-butanone, and butyl acetate, and
the polymer is at least one selected from Polymer 1; Polymer 2; Polymer 3; Polymer 4; Polymer 5; and Polymer 6:

[Polymer 1]

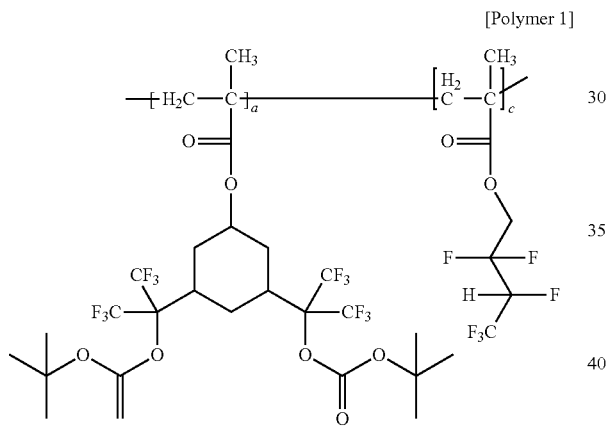

in the formula of Polymer 1, a is 100 parts by mole, and c is 10 to 900 parts by mole,

[Polymer 2]

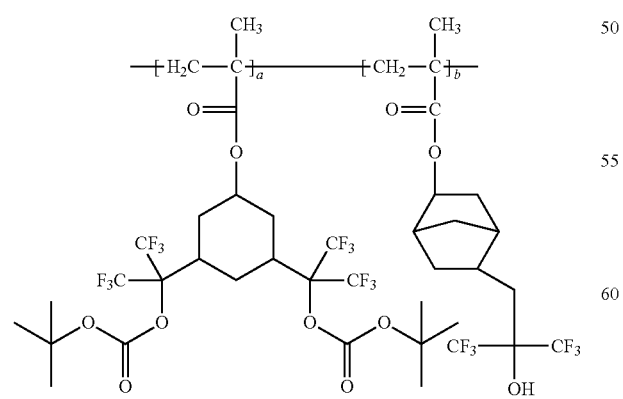

in the formula of Polymer 2, a is 100 parts by mole, and b is 10 to 900 parts by mole,

[Polymer 3]

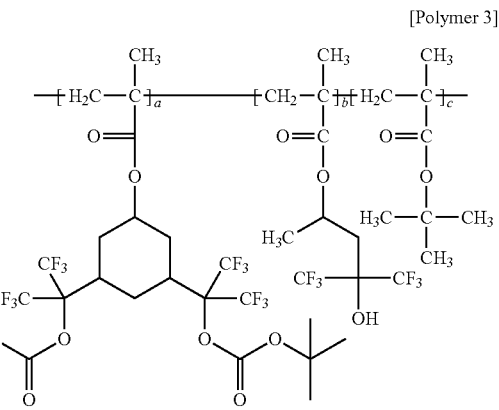

in the formula of Polymer 3, a is 100 parts by mole, b is 10 to 900 parts by mole, and c is 10 to 900 parts by mole,

[Polymer 4]

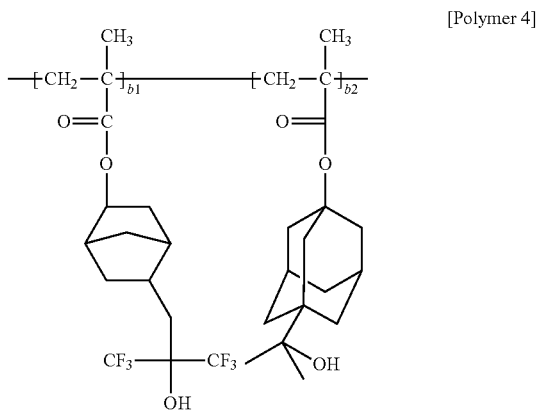

in the formula of Polymer 4, $b_1$ is 100 parts by mole, and $b_2$ is 10 to 900 parts by mole,

[Polymer 5]

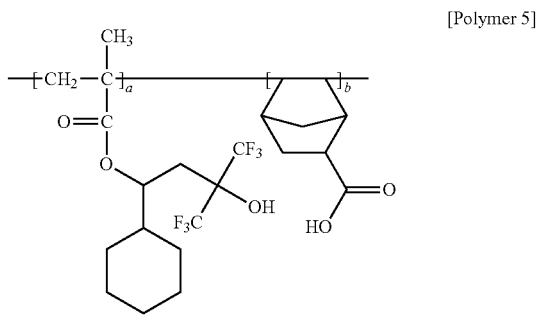

in the formula of Polymer 5, a is 100 parts by mole, and b is 10 to 900 parts by mole,

[Polymer 6]

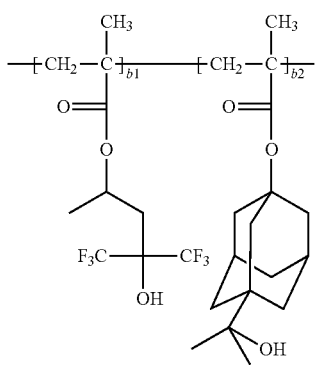

in the formula of Polymer 6, $b_1$ is 100 parts by mole, and $b_2$ is 10 to 900 parts by mole, the solvent further comprises at least one selected from an alkoxyalkane solvent and an alcohol solvent.

9. The method of claim 8, wherein the solvent further comprises an amount of an alkoxyalkane solvent of 10 to 1000 parts by weight based on 100 parts by weight of the material of an amount of an alcohol solvent of 10 to 1000 parts by weight based on 100 parts by weight of the material.

10. The method of claim 9, wherein the alcohol solvent is a C4-C11 monovalent alcohol, a C4-C11 divalent alcohol, or a C4-C20 polyvalent alcohol.

11. The method of claim 9, wherein the alkoxyalkane solvent is a C3-C16 dialkoxyalkane, trialkoxyalkane, or tetraalkoxyalkane.

12. The method of claim 8, wherein an amount of the polymer is 1 to 20 parts by weight based on 100 parts by weight of the solvent.

13. The method of claim 8, wherein the resist protective film composition further comprises at least one of an acid-generating compound and an acid compound, wherein an amount of the at least one of an acid-generating compound and an acid compound is 0.001 to 10 parts by weight based on 100 parts by weight of the polymer.

* * * * *